(12) United States Patent
Kurosawa

(10) Patent No.: US 7,885,776 B2
(45) Date of Patent: Feb. 8, 2011

(54) WAVEFORM GENERATOR, WAVEFORM GENERATING DEVICE, TEST APPARATUS, AND MACHINE READABLE MEDIUM STORING A PROGRAM THEREOF

(75) Inventor: Makoto Kurosawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 424 days.

(21) Appl. No.: 11/863,280

(22) Filed: Sep. 28, 2007

(65) Prior Publication Data

US 2009/0027134 A1   Jan. 29, 2009

(30) Foreign Application Priority Data

Jul. 24, 2007   (JP)   ............. 2007-192007

(51) Int. Cl.
*G01R 13/00*   (2006.01)
(52) U.S. Cl. ...................................... 702/72
(58) Field of Classification Search ............ 702/57, 702/66, 67, 72–75, 106, 107, 110, 118–120, 702/124, 126, 176, 189, 198; 332/100; 375/100, 375/280, 308, 324
See application file for complete search history.

(56) References Cited

U.S. PATENT DOCUMENTS 4,206,424 A * 6/1980 Nossen ................ 332/104
5,121,412 A * 6/1992 Borth ................ 375/308
5,420,887 A * 5/1995 Rhodes et al. ............. 375/295

FOREIGN PATENT DOCUMENTS

| JP | 02-070136 | 3/1990 |
|----|-----------|--------|
| JP | 08-237311 | 9/1996 |
| JP | 09-51359 | 2/1997 |
| JP | 2001-160834 | 6/2001 |
| JP | 2001-223585 | 8/2001 |
| JP | 2006-201173 | 8/2006 |

OTHER PUBLICATIONS

"Office Action of Japan Counterpart Application", issued on Oct. 18, 2007, p1-p2, in which the listed reference was cited.

* cited by examiner

*Primary Examiner*—Mohamed Charioui
(74) *Attorney, Agent, or Firm*—Jianq Chyun IP Office

(57) ABSTRACT

There is provided a waveform generator for generating an analog signal, including a data changing section which changes an input data sequence, which is a sequence of binary data and which is to be modulated to the signal which the waveform generator should generate, to generate an after-change data sequence such that in the signal to be obtained by MSK modulation, a residual phase obtained by dividing an initial phase of the signal by $2\pi$ and a residual phase obtained by dividing a final phase of the signal by $2\pi$ are continuous, a waveform generating section which generates basic waveform data representing a waveform corresponding to the signal obtained by subjecting the after-change data sequence to MSK modulation, and an output section which outputs the signal repeating the waveform represented by the basic waveform data.

13 Claims, 14 Drawing Sheets

AFTER-CHANGE DATA SEQUENCE    0  1  0  0  ...  1  0  1  1
*FIG. 6A*
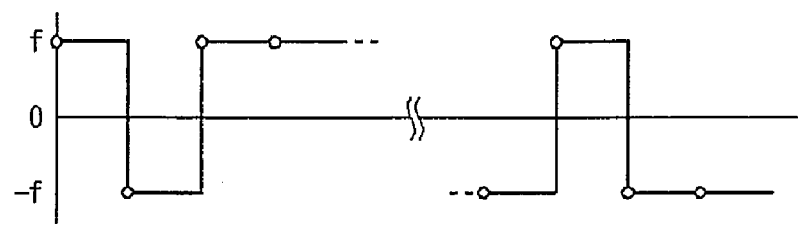
*FIG. 6B*
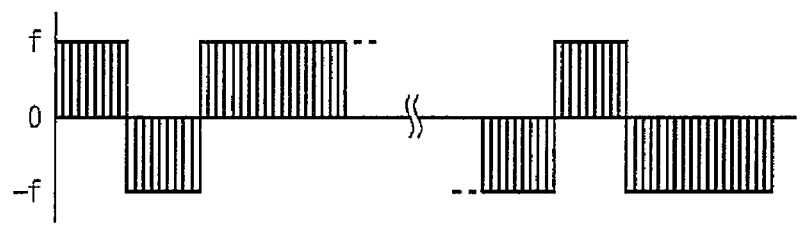
*FIG. 6C*
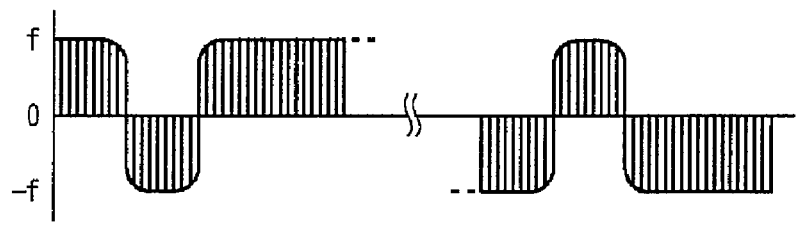
*FIG. 6D*
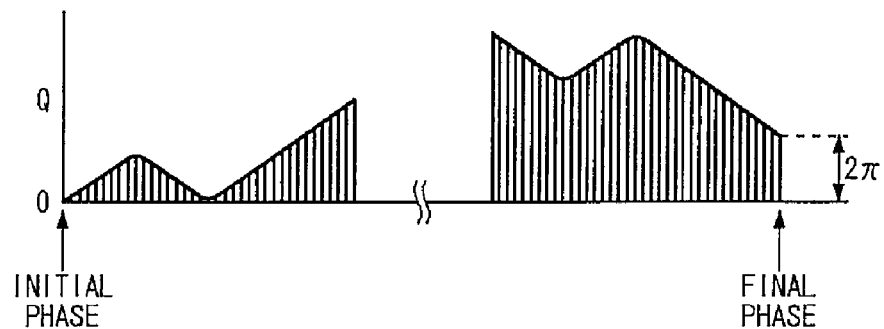
*FIG. 6E*

WAVEFORM GENERATOR, WAVEFORM GENERATING DEVICE, TEST APPARATUS, AND MACHINE READABLE MEDIUM STORING A PROGRAM THEREOF

CROSS REFERENCE TO RELATED APPLICATIONS

The present application claims priority from a Japanese Patent Application(s) No. 2007-192007 on Jul. 24, 2007, the contents of which are incorporated herein by reference.

BACKGROUND

1. Technical Field

The present invention relates to a waveform generator, a waveform generating device, a test apparatus, and a machine readable medium storing a program. Particularly, the present invention relates to a waveform generator, a waveform generating device, and a test apparatus which generate an analog signal, and a machine readable medium storing a program.

2. Related Art

A waveform generator reads out waveform data representing an arbitrary waveform from a waveform memory. Then, the waveform generator converts the read waveform data from digital to analog, and outputs a signal having the arbitrary waveform (see, e.g., Japanese Patent Application Publication No. 2001-223585). Further, the waveform generator can output a signal repeating the arbitrary waveform, by repetitively converting this waveform data from digital to analog.

Here, in repeatedly outputting an arbitrary waveform, if the final part and the initial part of the arbitrary waveform are discontinuous, the waveform generator cannot avoid outputting a signal including spurious. For example, in repeatedly outputting an arbitrary waveform obtained by modulating arbitrary data by MSK, if the initial phase and final phase of the arbitrary waveform are different, the waveform generator cannot avoid outputting a signal including a spurious.

SUMMARY

Hence, according to one aspect of the innovation included herein, an object is to provide a waveform generator, a waveform generating device, a test apparatus, and a machine readable medium storing a program which can solve the above-described problem. This object is achieved by combinations of the features recited in independent claims in the scope of claims. Further, dependent claims define additional advantageous specific examples of the present invention.

That is, according to one exemplary waveform generator according to an aspect relating to the innovation included herein, there is provided a waveform generator for generating an analog signal, including: a data changing section which changes an input data sequence, which is a sequence of binary data and which is to be modulated to the signal that the waveform generator should generate, to generate an after-change data sequence such that in the signal to be obtained by MSK modulation, a residual phase obtained by dividing an initial phase of the signal by $2\pi$ and a residual phase obtained by dividing a final phase of the signal by $2\pi$ are continuous; a waveform generating section which generates basic waveform data representing a waveform corresponding to the signal obtained by subjecting the after-change data sequence to MSK modulation; and an output section which outputs the signal repeating the waveform represented by the basic waveform data.

According to one exemplary waveform generating device according to an aspect relating to the innovation included herein, there is provided a waveform generating device for generating basic waveform data, which is a source of an analog signal to be generated by a waveform generator, including: a data changing section which changes an input data sequence, which is a sequence of binary data and which is to be modulated to the signal which the waveform generator should generate, to generate an after-change data sequence such that in the signal to be obtained by MSK modulation, a residual phase obtained by dividing an initial phase of the signal by $2\pi$ and a residual phase obtained by dividing a final phase of the signal by $2\pi$ are continuous; and a waveform generating section which generates basic waveform data representing a waveform corresponding to the signal obtained by subjecting the after-change data sequence to MSK modulation.

According to one exemplary test apparatus according to an aspect relating to the innovation included herein, there is provided a test apparatus which tests a device under test, and includes: a data changing section which changes an input data sequence, which is a sequence of binary data and which is to be modulated to a signal to be supplied to the device under test, to generate an after-change data sequence such that in the signal to be obtained by MSK modulation, a residual phase obtained by dividing an initial phase of the signal by $2\pi$ and a residual phase obtained by dividing a final phase of the signal by $2\pi$ are continuous; a waveform generating section which generates basic waveform data representing a waveform corresponding to the signal obtained by subjecting the after-change data sequence to MSK modulation; an output section which outputs a test signal which repeats the waveform represented by the basic waveform data; and a measuring section which measures a characteristic of the device under test based on an output signal output from the device under test in response to the test signal.

According to one exemplary machine readable medium storing a program according to an aspect relating to the innovation included herein, there is provided a machine readable medium storing a program for controlling an information processing apparatus to function as a waveform generating device which generates basic waveform data to be a source of an analog signal to be generated by a waveform generator, the program controlling the information processing apparatus to function as: a data changing section which changes an input data sequence, which is a sequence of binary data and which is to be modulated to the signal which the waveform generator should generate, to generate an after-change data sequence such that in the signal to be obtained by MSK modulation, a residual phase obtained by dividing an initial phase of the signal by $2\pi$ and a residual phase obtained by dividing a final phase of the signal by $2\pi$ are continuous; and a waveform generating section which generates basic waveform data representing a waveform corresponding to the signal obtained by subjecting the after-change data sequence to MSK modulation.

Note that the above summary of the invention is not intended to list all necessary features of the present invention, but sub-combinations of these features can also provide inventions.

BRIEF DESCRIPTION OF THE DRAWINGS

FIGS. 6A-E show one example of each signal in the waveform generating section 44 in a case where basic waveform data representing a waveform corresponding to a signal obtained by MSK modulation is to be generated.

DESCRIPTION OF EXEMPLARY EMBODIMENTS

One aspect of the present invention will be explained below through an embodiment of the invention, but the embodiment below is not intended to limit the invention set forth in the claims or all the combinations of the features explained in the embodiment are not necessarily essential to the means of solving provided by the invention.

Figure 1:
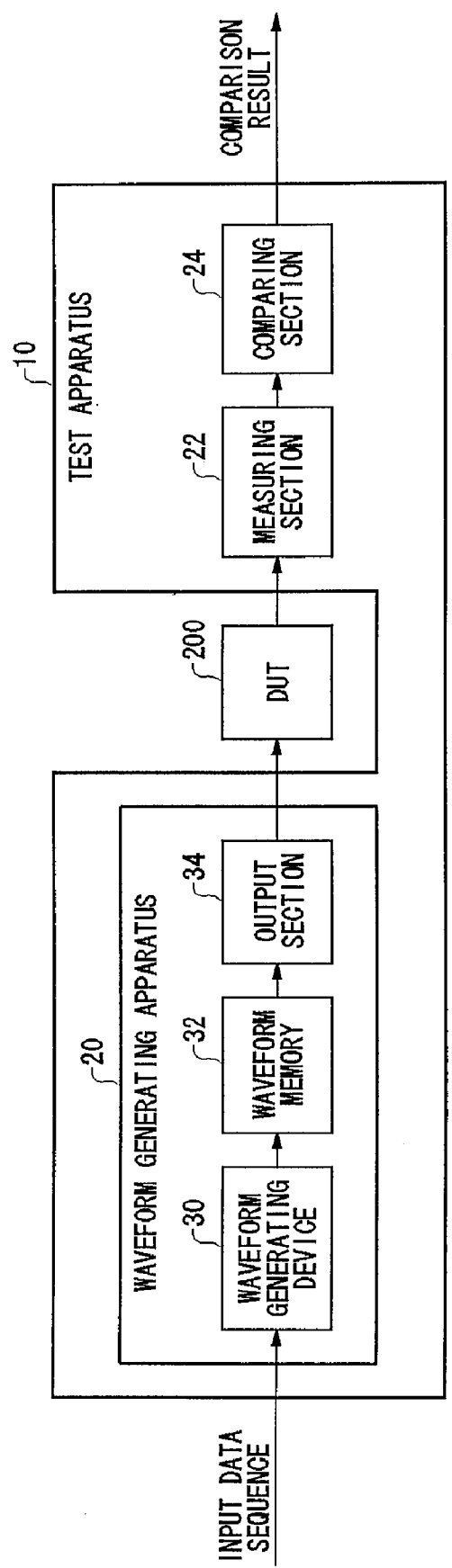
FIG. 1 shows the configuration of a test apparatus 10 according to an embodiment of the present invention, together with a DUT 200.

FIG. 1 shows the configuration of a test apparatus 10 according to the present embodiment, together with a DUT (Device Under Test) 200. The test apparatus 10 tests the DUT 200. The DUT 200 may be, for example, an amplifier, a modulator, a demodulator, or the like used in a communication device such as a GSM (Global System for Mobile Communications), etc.

The test apparatus 10 includes a waveform generator 20, a measuring section 22, and a comparing section 24. The waveform generator 20 generates an analog signal. Then, the waveform generator 20 supplies the generated analog signal to the DUT 200 as a test signal.

The waveform generator 20 includes a waveform generating device 30, a waveform memory 32, and an output section 34. The waveform generating device 30 receives, from, for example, the outside, an input data sequence which should be modulated to a signal generated by the waveform generator 20, i.e., an input data sequence which should be modulated to a signal to be supplied to the DUT 200. Then, based on the received input data sequence, the waveform generating device 30 generates basic waveform data, which is to be the source of an analog signal to be generated by the waveform generator 20. For example, the waveform generating device 30 may receive the input data sequence and generate the basic waveform data, in advance of a test on the DUT 200.

The waveform memory 32 stores the basic waveform data generated by the waveform generating device 30. The output section 34 reads out the basic waveform data stored in the waveform memory 32, and converts it, for example, from digital to analog. Then, the output section 34 outputs a test signal, which repeats the waveform represented by the basic waveform data, to the DUT 200.

The measuring section 22 receives an output signal which is output from the DUT 200 in response to the test signal being supplied thereto. Then, the measuring section 22 measures characteristics of the DUT 200 based on the received output signal. The measuring section 22 may measure, for example, the electrical power (spectrum characteristic) of the output signal output from the DUT 200 at each frequency of the signal. Instead of this or in addition to this, the measuring section 22 may measure, for example, leak electricity to any channel having a frequency close to that of the DUT 200, or may measure the electrical power at each frequency within a range of frequencies to be measured, with the outside of the range masked.

The comparing section 24 compares the result of measurement by the measuring section 22 with an expectation value, and judges whether the DUT 200 is good or defective. The comparing section 24 may, for example, compare the result of measurement by the measuring section 22 with an expectation value and classify the DUT 200 into any class. The test apparatus 10 having this configuration can supply a test signal repeating the waveform represented by the basic waveform data to the DUT 200 and measure characteristics of the DUT 200 based on the output signal output in response to this test signal being supplied.

Figure 2:
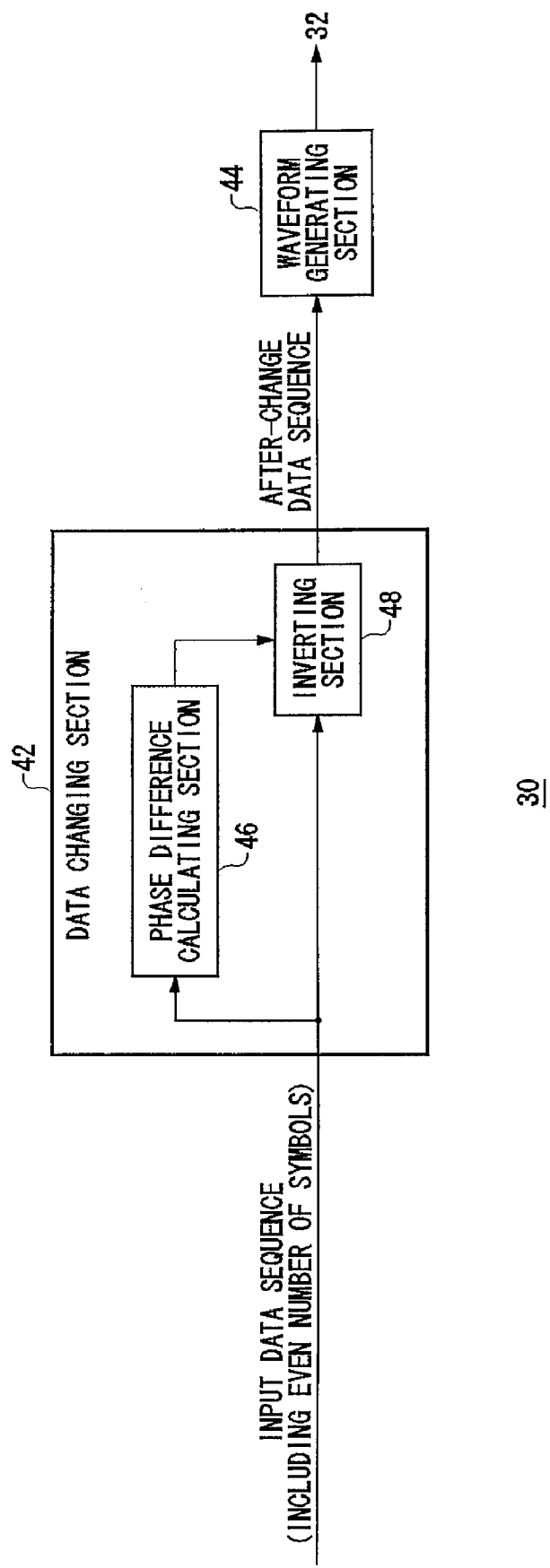
FIG. 2 shows the configuration of a waveform generating device 30 according to an embodiment of the present invention.

FIG. 2 shows the configuration of the waveform generating device 30 according to the present embodiment. The waveform generating device 30 includes a data changing section 42 and a waveform generating section 44.

The data changing section 42 changes the input data sequence to generate an after-change data sequence such that in the signal to be obtained by MSK (Minimum Shift Keying) modulation, a residual phase obtained by dividing the initial phase of the signal by $2\pi$ (radian) and a residual phase obtained by dividing the final phase of the signal by $2\pi$ (radian) will be continuous. The waveform generating section 44 MSK-modulates the after-change data sequence generated by the data changing section 42 and generates basic waveform data which represents a waveform corresponding to the MSK-modulated signal. The MSK modulation by the waveform generating section 44 and the MSK modulation by the data changing section 42 are MSK modulations by which phases of symbols are made continuous, and in which the same modulation frequency is used.

According to the waveform generating device 30 having the above-described configuration, in a case where the waveform generator 20 is to repeatedly output the waveform corresponding to the signal obtained by MSK modulation, any spurious that might occur where the repetitive waveforms contact each other (the point at which the end portion and the start portion contact each other) can be reduced. And the test apparatus 10 having this waveform generating device 30 can measure characteristics of the DUT 200 with high accuracy.

Note that MSK modulation is FSK modulation in which the modulation index is 0.5. That is, the data changing section 42 may generate an after-change data sequence such that in the signal to be obtained by MSK modulation using frequencies f and −f represented by the equations (1) and (2) given below, the initial phase and final phase of the signal are continuous.

$$f = R \times 0.25 \quad (1)$$

$$-f = -R \times 0.25 \quad (2)$$

In the equations (1) and (2), R represents symbol rate. That is, R is the symbol frequency of the data sequence carried in the signal generated by the waveform generator 20.

Here, in order that the data changing section 42 can make the 2π-division residual phase of the initial phase of the signal, which is to be obtained by MSK modulation, and the 2π-division residual phase of the final phase of that signal continuous, the 2π-division residual phase of the initial phase of the signal to be obtained by the MSK modulation and the 2π-division residual phase of the final phase of that signal must be coincident. In order that the 2π-division residual phase of the initial phase and the 2π-division residual phase of the final phase are coincident in the signal to be obtained by the MSK modulation, the equation (3) given below must be satisfied.

$$\sum_{n=0}^{N-1} f_r(n) + \text{Phase}(0) = 2\pi k + \text{Phase}(0) \quad (3)$$

In the equation (3), n represents the symbol number of each symbol in the input data sequence, N represents the number of symbols included in the input data sequence, $f_r(n)$ represents the angular frequency to be assigned to the data value of the n-th symbol through the MSK modulation, Phase(0) represents the initial phase of the signal obtained by subjecting the input data sequence to the MSK modulation, and k represents an arbitrary integer.

In the case of MSK modulation, $f_r(n)$ should be either $+\pi/2$ or $-\pi/2$. Accordingly, where the number of symbols N is an even number, the cumulative value of $f_r(n)$ in the left-hand side of the equation (3) (the cumulative value being the result of Σ, i.e., the value obtained by accumulating $f_r(0)$ to $f_r(N-1)$) is $2\pi k$ or $(2\pi k+\pi)$ (k being an arbitrary integer). As known from this, the equation (3) above is satisfied on the condition that the number of symbols N is an even number.

Further, each individual symbol included in the signal obtained by the MSK modulation has been shifted in phase by $\pm\pi/2$. That is, if the values of an odd number of symbols included in the signal obtained by the MSK modulation are inversed, the phase is shifted by $(m_1 \times \pi)$ ($m_1$ being an arbitrary odd number) whereas if the values of an even number (including 0) of symbols are inversed, the phase is shifted by $m_2 \times \pi$ ($m_2$ being an arbitrary even number). Accordingly, in a case where the cumulative value of $f_r(n)$ in the left-hand side of the equation (3) is $2\pi k+\pi$, if the values of an odd number of symbols included in the input data sequence are inversed, the equation (3) above is satisfied for the data sequence after thusly inversed.

From this fact, it can be understood that an input data sequence which includes an even number of symbols and whose signal, to be obtained by MSK modulation, will show a phase difference which is an integer multiple of 2π between its initial phase and its final phase will be an MSK-modulated signal in which the 2π-division residual phase of its initial phase and the 2π-division residual phase of its final phase coincide with each other. Further, it can be understood that an after-change data sequence, which is obtained by inverting the values of an even number (including 0) of symbols included in such an input data sequence, will be an MSK-modulated signal in which the 2π-division residual phase of its initial phase and the 2π-division residual phase of its final phase coincide with each other.

Further, an input data sequence which includes an even number of symbols and whose signal, to be obtained by MSK modulation, will show a phase difference which is no integer multiple of 2π between its initial phase and its final phase will be an MSK-modulated signal in which the 2π-division residual phase of its initial phase and the 2π-division residual phase of its final phase do not coincide with each other (produce a difference of π). However, it can be known that an after-change data sequence, which is obtained by inverting the values of an odd number of symbols included in such an input data sequence, will be an MSK-modulated signal in which the 2π-division residual phase of its initial phase and the 2π-division residual phase of its final phase coincide with each other.

In view of the above, for example, by having a phase difference calculating section 46 and an inverting section 48, the data changing section 42 can generate an after-change data sequence, which is to be MSK-modulated and become a signal in which the 2π-division residual phase of its initial phase and the 2π-division residual phase of its final phase are continuous. The phase difference calculating section 46 receives an input data sequence including an even number of symbols from the outside. Then, the phase difference calculating section 46 calculates the phase difference between the initial phase and terminal phase of a waveform obtained by MSK-modulating the input data sequence.

In a case where the phase difference calculated by the phase difference calculating section 46 is not an integer multiple of 2π (i.e., in a case where the phase difference is $(2\pi k+\pi)$), the inverting section 48 inverts the data values of an odd number of symbols included in the input data sequence. For example, the inverting section 48 selects an odd number of symbols included in the input data sequence, and inverts the selected symbols to a data value 1 in a case where they have a data value 0 while inverts the selected symbols to a data value 0 in a case where they have a data value 1.

Further, in a case where the phase difference calculated by the phase difference calculating section 46 is an integer multiple of 2π (i.e., in a case where the phase difference is $(2\pi k)$), the inverting section 48 inverts the data values of an even number of symbols included in the input data sequence. For example, the inverting section 48 selects an even number of symbols included in the input data sequence, and inverts the selected symbols to a data value 1 in a case where they have a data value 0 while inverts the selected symbols to a data value 0 in a case where they have a data value 1.

For example, the inverting section 48 may invert the data value of any one of the symbols included in the input data sequence in a case where the phase difference is not an integer multiple of 2π, and may invert the data value of none of the symbols included in the input data sequence in a case where the phase difference is an integer multiple of 2π. Then, the inverting section 48 outputs the data sequence obtained by inversion as the after-change data sequence. In this manner, the data changing section 42 can generate an after-change data sequence, which is to be MSK-modulated and become a signal in which the 2π-division residual phase of its initial phase and the 2π-division residual phase of its final phase are continuous.

Figure 3:
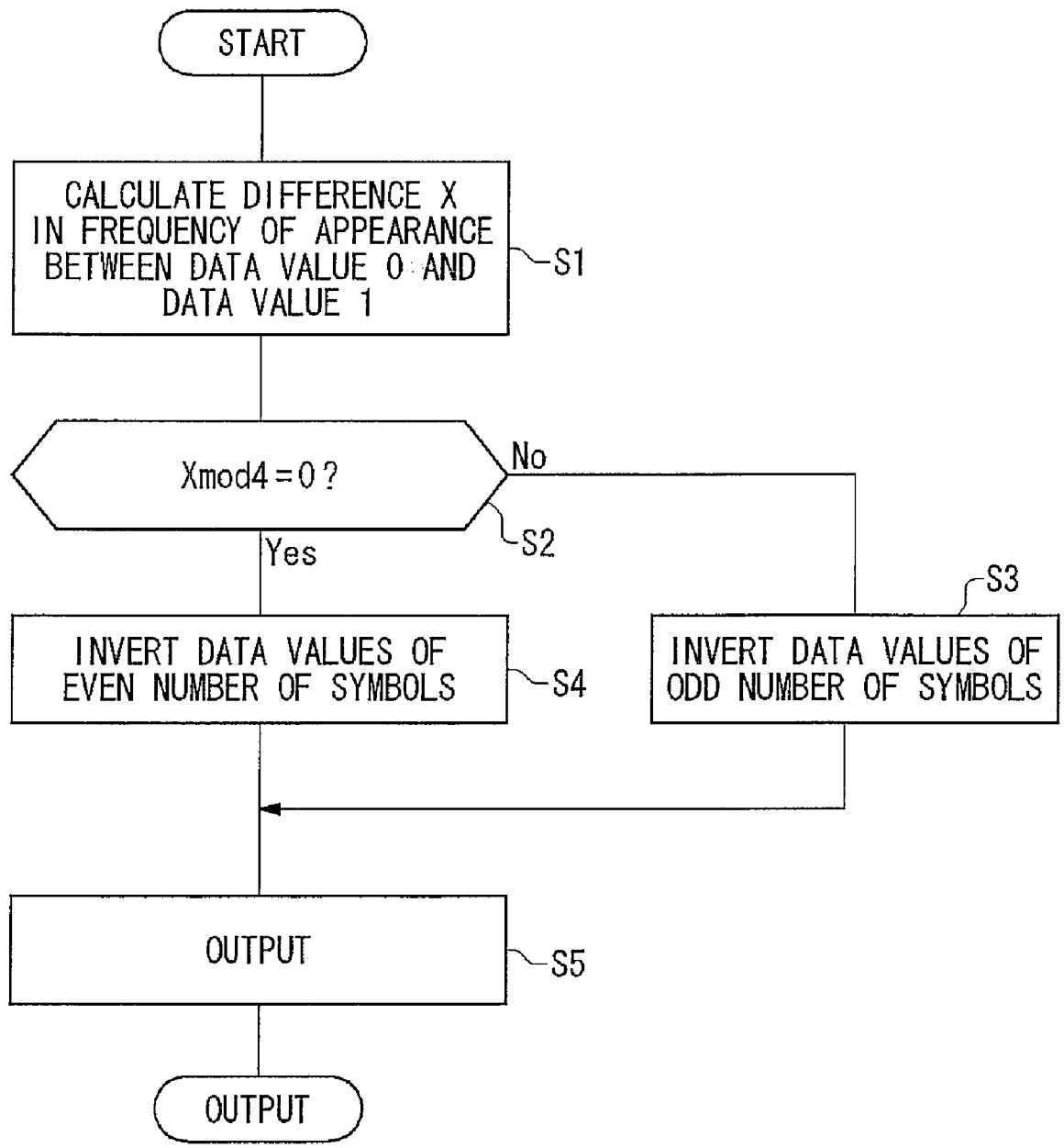
FIG. 3 shows one example of a method according to an embodiment of the present invention, by which a data changing section 42 generates an after-change data sequence.

FIG. 3 shows one example of a method by which the data changing section 42 shown in FIG. 2 generates an after-change data sequence. First, the phase difference calculating section 46 calculates the difference between how often a data value 0 appears and how often a data value 1 appears in the input data sequence (S1). For example, the phase difference calculating section 46 may convert a data value 0 in the input data sequence to +1 (or −1) while convert a data value 1 to −1 (or +1) to obtain the sum of the converted values as the difference in frequency of appearance.

Here, the difference in frequency of appearance between the data value 0 and the data value 1 in the input data sequence represents the phase difference between the initial phase and final phase of a waveform obtained by MSK-modulating the input data sequence. In a case where the difference in frequency of appearance is 1, the phase difference between the initial phase and the final phase is π/2. Accordingly, in a case where the difference in frequency of appearance between the data value 0 and the data value 1 is a multiple of 4, the phase difference between the initial phase and final phase of the waveform obtained by MSK-modulating the input data sequence is 2πk, whereas in a case where the difference in frequency of appearance is other than a multiple of 4 (a value which is a multiple of 2 but not a multiple of 4), the phase difference is 2πk+π.

Next, the inverting section 48 judges whether the difference in frequency of appearance calculated at step S1 is a multiple of 4 or not (S2). For example, the inverting section 48 may judge whether a residual obtained by dividing the difference in frequency of appearance by 4 is 0 or not (S2).

In a case where the difference in frequency of appearance is not a multiple of 4, for example, in a case where the residual obtained by dividing the difference in frequency of appearance by 4 is not 0 (S2; No), the inverting section 48 inverts the data values of an odd number of symbols included in the input data sequence to obtain an after-change data sequence (S3). In a case where the difference in frequency of appearance is not a multiple of 4, the inverting section 48 may, for example, invert the data value of any one symbol (for example, the one symbol at the top or the one symbol at the tail) included in the input data sequence to generate the after-change data sequence.

In a case where the difference in frequency of appearance is a multiple of 4, for example, in a case where the residual obtained by dividing the difference in frequency of appearance by 4 is 0 (S2; Yes), the inverting section 48, for example, inverts the data values of an even number of symbols included in the input data sequence to obtain an after-change data sequence (S4). In a case where the difference in frequency of appearance is a multiple of 4, the inverting section 48 may, for example, invert the data value of none of the symbols included in the input data sequence to generate the after-change data sequence.

Then, the inverting section 48 outputs the after-change data sequence generated at step S3 or step S4 to the waveform generating section 44 (S5). In this manner, the data changing section 42 can generate an after-change data sequence, which is to be MSK-modulated and become a signal in which the 2π-division residual signal of its initial phase and the 2π-division residual signal of its final phase are continuous.

Figure 4:
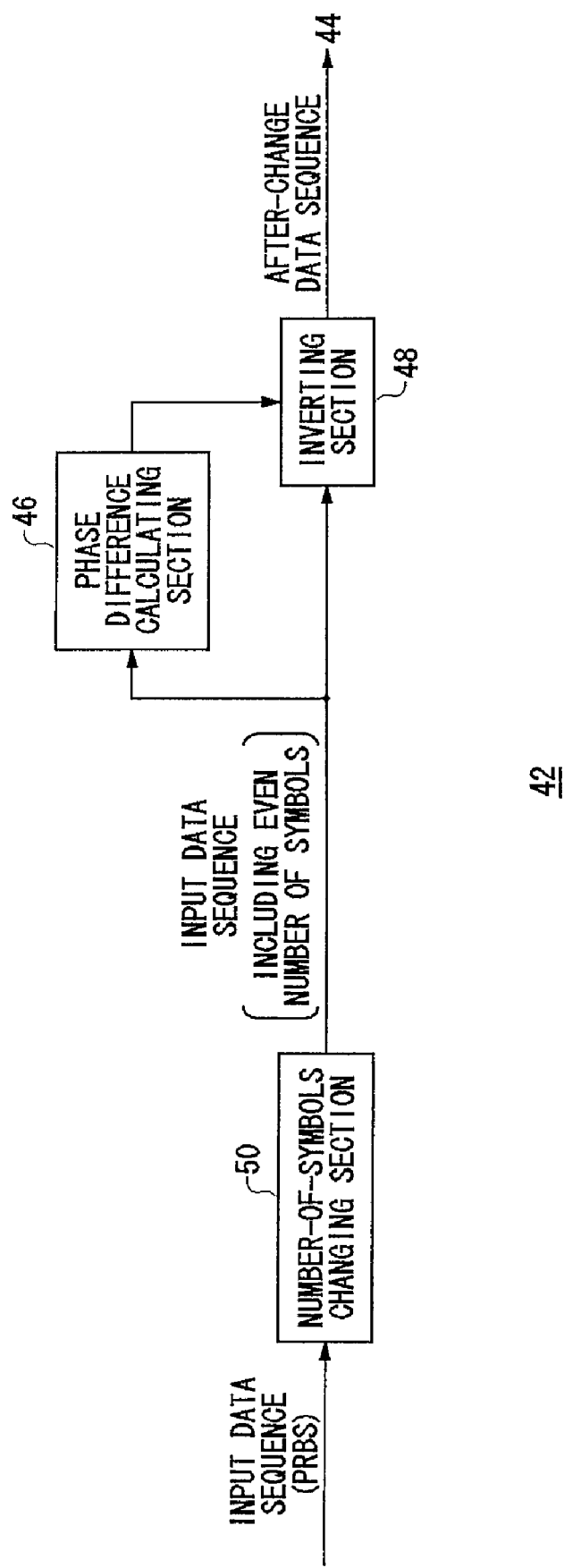
FIG. 4 shows one example of the configuration of the data changing section 42 according to a modification example.

FIG. 4 shows another example of the configuration of the data changing section 42 according to the present embodiment. For example, the data changing section 42 may include a phase difference calculating section 46, an inverting section 48, and a number-of-symbols changing section 50. The phase difference calculating section 46 and the inverting section 48 have generally the same configuration and function as those of the members shown in FIG. 2 having the same reference numerals, and detailed explanation thereof will thus be omitted.

In a case where the number of symbols included in a received input data sequence is an odd number, the number-of-symbols changing section 50 adds or deletes an odd number of symbols to or from this input data sequence and supplies it to the phase difference calculating section 46 and the inverting section 48. The data changing section 42 having this configuration can supply an input data sequence including an even number of symbols to the phase difference calculating section 46 and the inverting section 48, even in a case where there is a possibility that an input data sequence including not an even number of symbols will be input from the outside.

The number-of-symbols changing section 50 may receive a pseudorandom code sequence having an odd symbol length (for example, a PN9 data sequence having 511 bits) as an input data sequence. In this case, the number-of-symbols changing section 50 adds an odd number of symbols to the back of the last symbol (or to the front of the top symbol) in the received pseudorandom code sequence. Instead of this, the number-of-symbols changing section 50 may delete an odd number of last (or top) symbols in the received pseudorandom code sequence. Thereby, the data changing section 42 can generate an input data sequence having a length corresponding to an even number of symbols while keeping the randomness of the codes.

Figure 5:
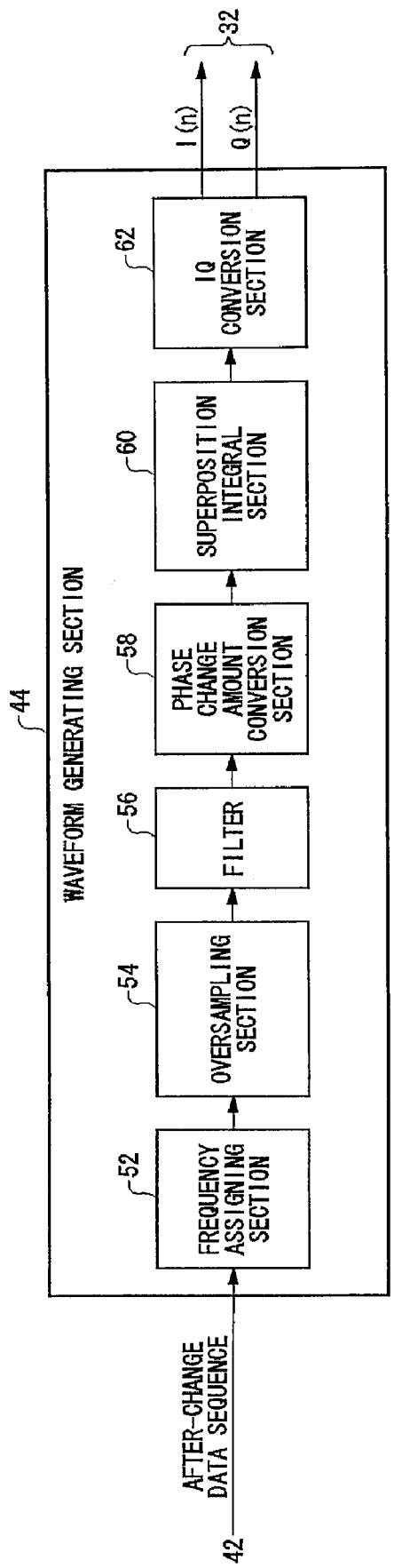
FIG. 5 shows one example of the configuration of a waveform generating section 44 according to an embodiment of the present invention.

FIG. 5 shows one example of the configuration of the waveform generating section 44 according to the present embodiment. FIG. 6 shows one example of each type of signal in the waveform generating section 44 in a case where basic waveform data representing a waveform corresponding to a signal which is obtained by 2-frequency MSK modulation is to be generated.

For example, the waveform generating section 44 may include a frequency assigning section 52, an oversampling section 54, a filter 56, a phase change amount conversion section 58, a superposition integral section 60, and an IQ conversion section 62. The frequency assigning section 52 receives an after-change data sequence from the data changing section 42. For example, the frequency assigning section 52 may receive a binary after-change data sequence as shown by (A) in FIG. 6, which is obtained from a pseudorandom bit sequence (PRBS) which has been changed to include an even number of symbols and changed such that a difference in frequency of appearance between the data value 0 and the data value 1 is a multiple of 4.

Then, the frequency assigning section 52 converts each data value in the received after-change data sequence to a frequency value, which is to be assigned to the data value when it is MSK-modulated, and sequentially outputs the converted frequency values. For example, in a case where the after-change data sequence shown by (A) in FIG. 6 is received, the frequency assigning section 52 may convert a data value 0 to a frequency value indicating a frequency f and a data value 1 to a frequency value indicating a frequency −f as shown by (B) in FIG. 6, and sequentially output the converted frequency values.

The oversampling section 54 oversamples the sequence of frequency values output from the frequency assigning section 52 at a predetermined oversampling ratio. That is, the oversampling section 54 converts the sequence of frequency values corresponding to the symbol rate to a sequence of frequency values corresponding to the sampling rate (symbol rate×oversampling ratio) of the basic waveform data to be generated. For example, the oversampling section 54 may convert the sequence of frequency values f and frequency values −f shown by (B) in FIG. 6 to a sequence as shown by (C) in FIG. 6, which is obtained by interpolating the former sequence with a zero-order hold filter and then oversampling it.

The filter 56 applies filtering to the sequence of oversampled frequency values output from the oversampling section 54, by a filter such as a Gaussian filter, an averaging filter, or the like. For example, the filter 56 may apply filtering to the sequence of oversampled frequency values f and frequency values −f shown by (C) in FIG. 6, by using a Gaussian filter or the like, as shown by (D) in FIG. 6. Thereby, the filter 56 can smooth the phase change at the boundary between symbols, and reduce spurious that might occur about the boundary between symbols.

Further, the filter 56 may apply circular filtering to the start portion and end portion of the sequence of oversampled frequency values by a filter such as, for example, a Gaussian filter, an averaging filter, or the like. That is, the filter 56 may add the end portion of the sequence of oversampled frequency values to the front of the start portion thereof and perform filtering of this start portion. Further, the filter 56 may add the start portion of the sequence of oversampled frequency values to the back of the end portion thereof and perform filtering of this end portion. Thereby, the filter 56 can smooth the phase change from the end portion to start portion of the sequence of frequency values. Further, in a case where the signal represented by the basic waveform data generated by the waveform generating section 44 is repeatedly output, the filter 56 can reduce spurious that might occur at the boundary of repetitions.

The phase change amount conversion section 58 converts the sequence of frequency values filtered by the filter 56 to a sequence of phase change amounts. That is, the phase change amount conversion section 58 calculates a phase change amount by multiplying each frequency value by a value ($2\pi$/fs) obtained by dividing $2\pi$ by the sampling frequency. Then, the phase change amount conversion section 58 sequentially outputs the calculated phase change amounts. Note that fs represents sampling frequency.

The superposition integral section 60 converts the sequence of phase change amounts output from the phase change amount conversion section 58 to a sequence of phase values as shown by (E) in FIG. 6. That is, the superposition integral section 60 cumulatively adds up the phase change amounts sequentially output, to calculate the phase at each sampling point.

Note that the after-change data sequence includes an even number of symbols and has a difference, which is a multiple of 4, between the frequency of appearance of the data value 0 and the frequency of appearance of the data value 1. Accordingly, the sequence of phase values generated by the superposition integral section 60 has an initial value (initial phase) and a final value (final phase), which are integer multiples of $2\pi$, as shown by (E) in FIG. 6.

The IQ conversion section 62 converts the sequence of phase values output from the superposition integral section 60 to a sequence of I components (real number components) and Q components (imaginary number components) on an orthogonal coordinate system. Then, the IQ conversion section 62 writes the converted sequence of I components and Q components into the waveform memory 32 as basic waveform data.

The waveform generating section 44 having this configuration can generate basic waveform data representing a waveform, which corresponds to a signal obtained by MSK-modulating an after-change data sequence, and in which the initial phase and the final phase are continuous. In the waveform generating section 44, the filter 56 may be set at the stage after the phase change amount conversion section 58, instead of the stage after the oversampling section 54. In this case too, the filter 56 achieves the same effect as in the case where it is set at the stage after the oversampling section 54.

Figure 7:
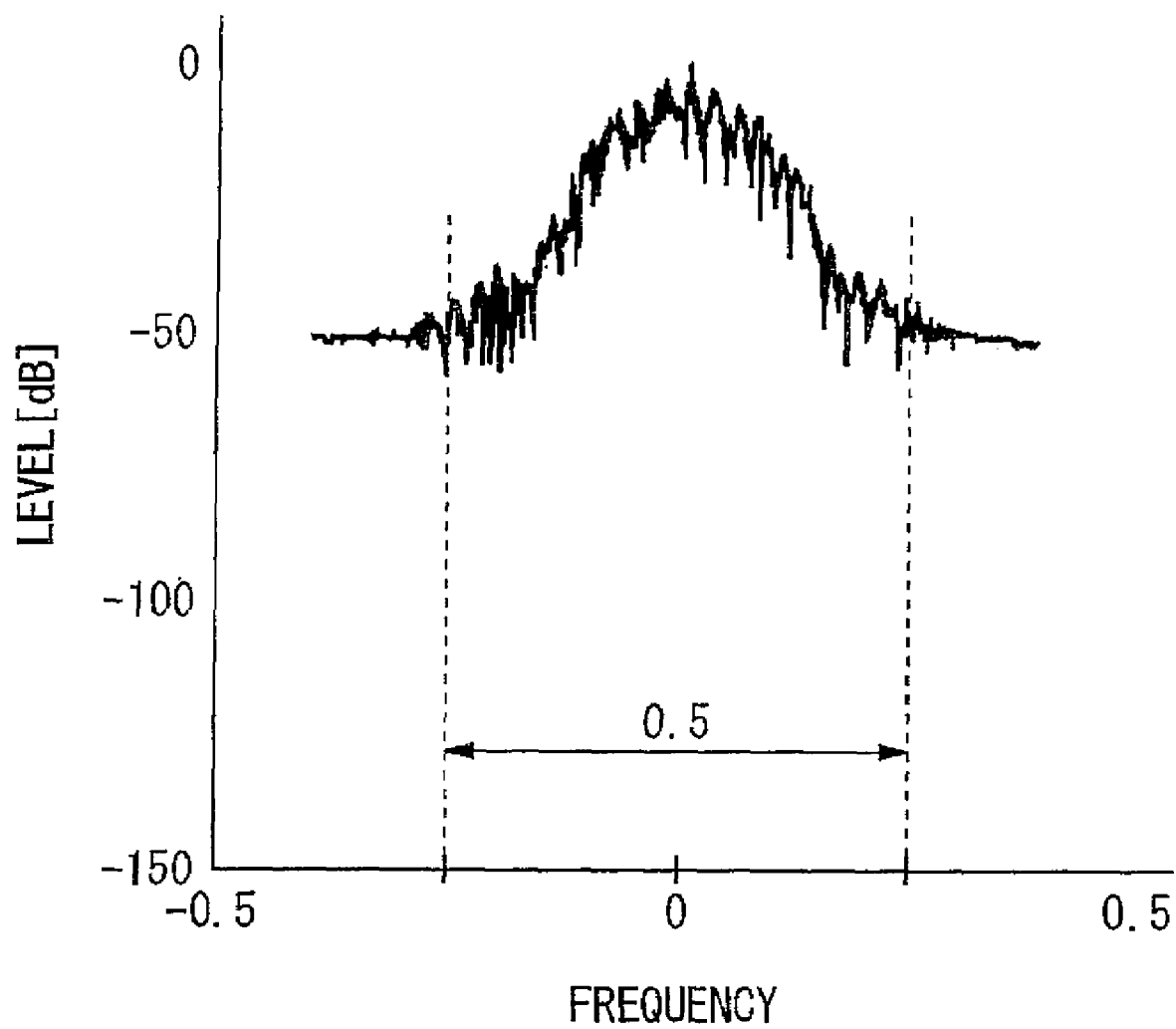
FIG. 7 shows the result of FFT operation on a waveform corresponding to basic waveform data of a case where a PN9 pseudorandom code is supplied to the waveform generating section 44.
Figure 8:
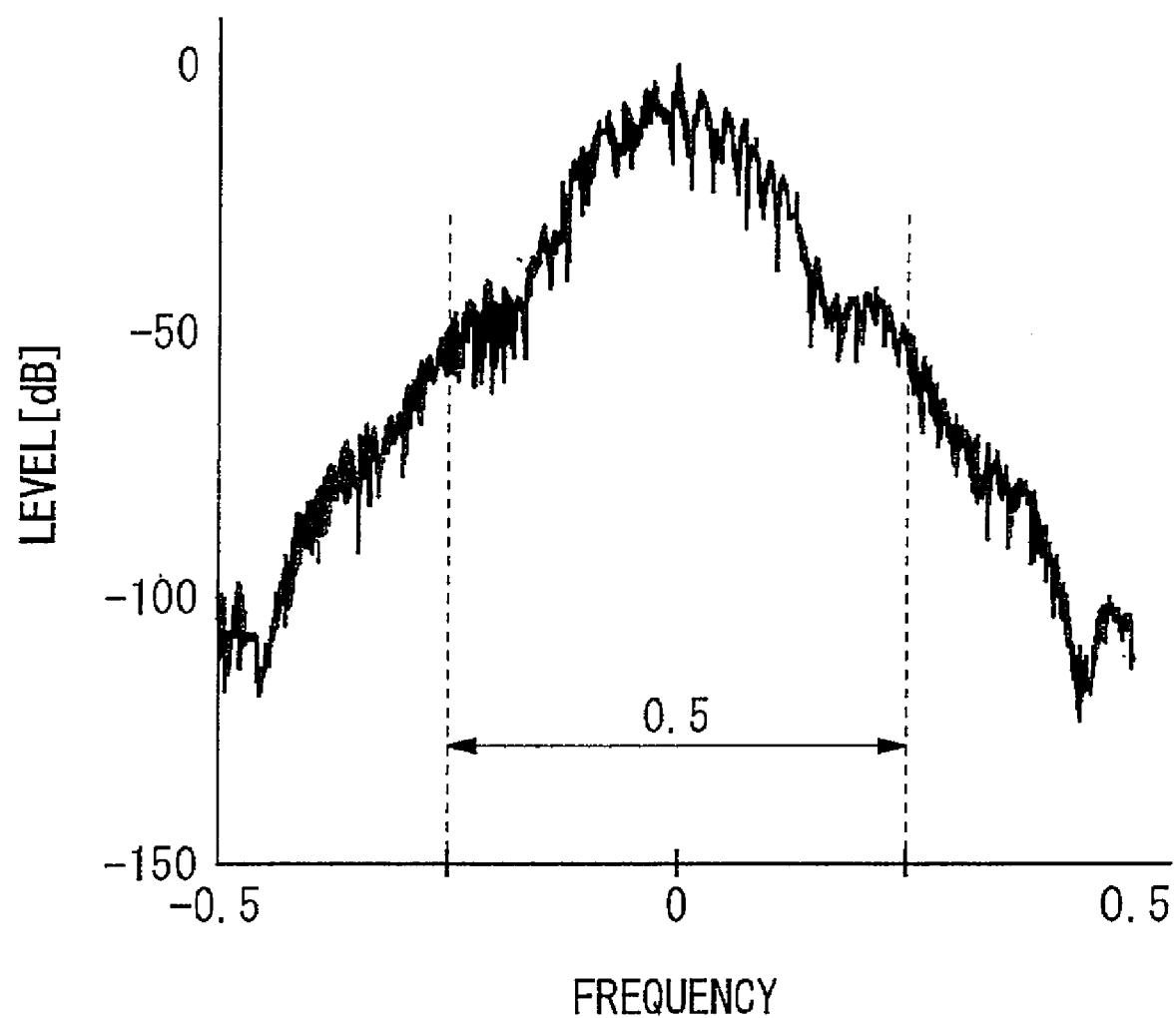
FIG. 8 shows the result of FFT operation on a waveform corresponding to basic waveform data of a case where an after-change data sequence obtained by adding inverted data obtained by inverting a PN9 pseudorandom code to the pseudorandom code is supplied to the waveform generating section 44.

FIG. 7 shows the result of FFT operations on a waveform corresponding to basic waveform data of a case where a PN9 pseudorandom code is supplied to the waveform generating section 44. FIG. 8 shows the result of FFT operations on a waveform corresponding to basic waveform data of a case where an after-change data sequence generated based on a PN9 pseudorandom code is supplied to the waveform generating section 44. Note that FIG. 7 and FIG. 8 show FFT operation results of a case where the filter 56 is a Gaussian filter whose BT is 0.3.

In a case where the waveform generating section 44 MSK-modulates a PN9 pseudorandom code, the levels of the components at the frequency of −0.25 and lower and the components at the frequency of 0.25 and higher are −50 dB and higher, as shown in FIG. 7. As compared with this, in a case where the waveform generating section 44 MSK-modulates an after-change data sequence, the range of the components at the frequency of −0.25 and lower and the components at the frequency of 0.25 and higher is under the level −50 dB, as shown in FIG. 8. As known from this, according to the waveform generating device 30, in a case where an after-change data sequence is MSK-modulated, spurious, which is outside the range of frequencies for the MSK modulation (−2.5 to +2.5), can be reduced.

Figure 9:
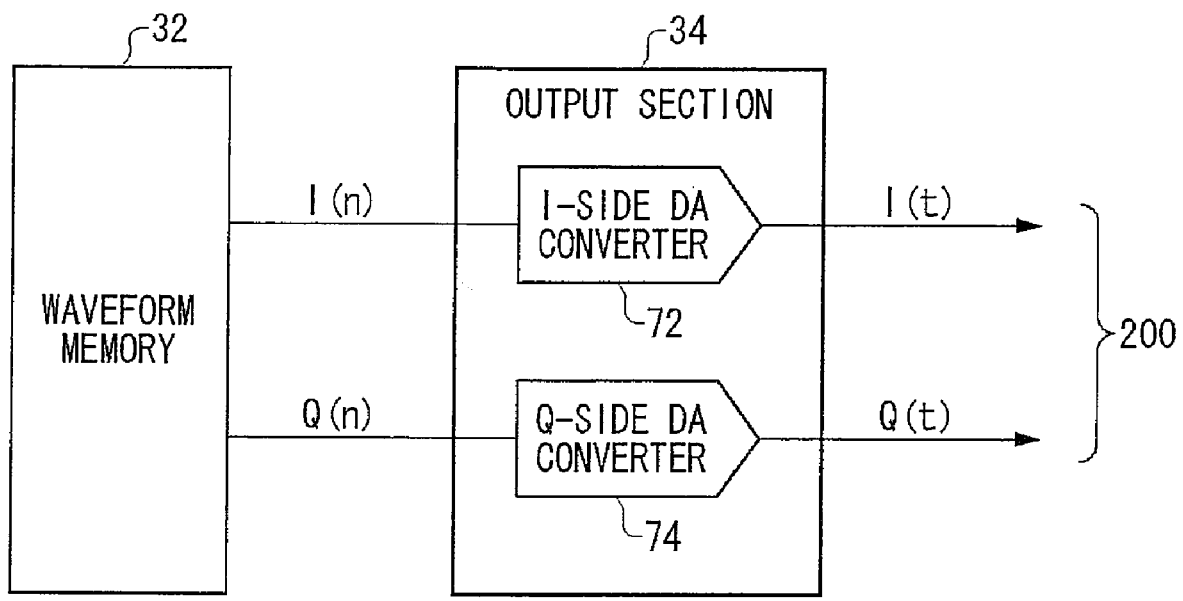
FIG. 9 shows a first example of the configuration of an output section 34, together with a waveform memory 32.

FIG. 9 shows a first example of the configuration of the output section 34, together with the waveform memory 32. The output section 34 may, for example, include an I-side DA converter 72, and a Q-side DA converter 74.

The I-side DA converter 72 sequentially reads out the sequence of I components of the basic waveform data stored in the waveform memory 32 at the sampling rate, and generates an analog signal through digital-to-analog conversion of these components. Then, the I-side DA converter 72 outputs the generated analog signal to the DUT 200 as a test signal. In this manner, the I-side DA converter 72 can output the real number components (I(t)) of the signal obtained by MSK-modulating the after-change data sequence, to the DUT 200 as the test signal.

The Q-side DA converter 74 sequentially reads out the sequence of Q components of the basic waveform data stored in the waveform memory 32 at the sampling rate, and generates an analog signal through digital-to-analog conversion of these components. Then, the Q-side DA converter 74 outputs the generated analog signal to the DUT 200 as a test signal. In this manner, the Q-side DA converter 74 can output the imaginary number components (Q(t)) of the signal obtained by MSK-modulating the after-change data sequence, to the DUT 200 as the test signal.

Further, each of the I-side DA converter 72 and the Q-side DA converter 74 continuously and repetitively converts the basic waveform data from digital to analog. Thereby, the I-side DA converter 72 and the Q-side DA converter 74 can output a test signal which repeats the waveform represented by the basic waveform data, to the DUT 200.

Figure 10:
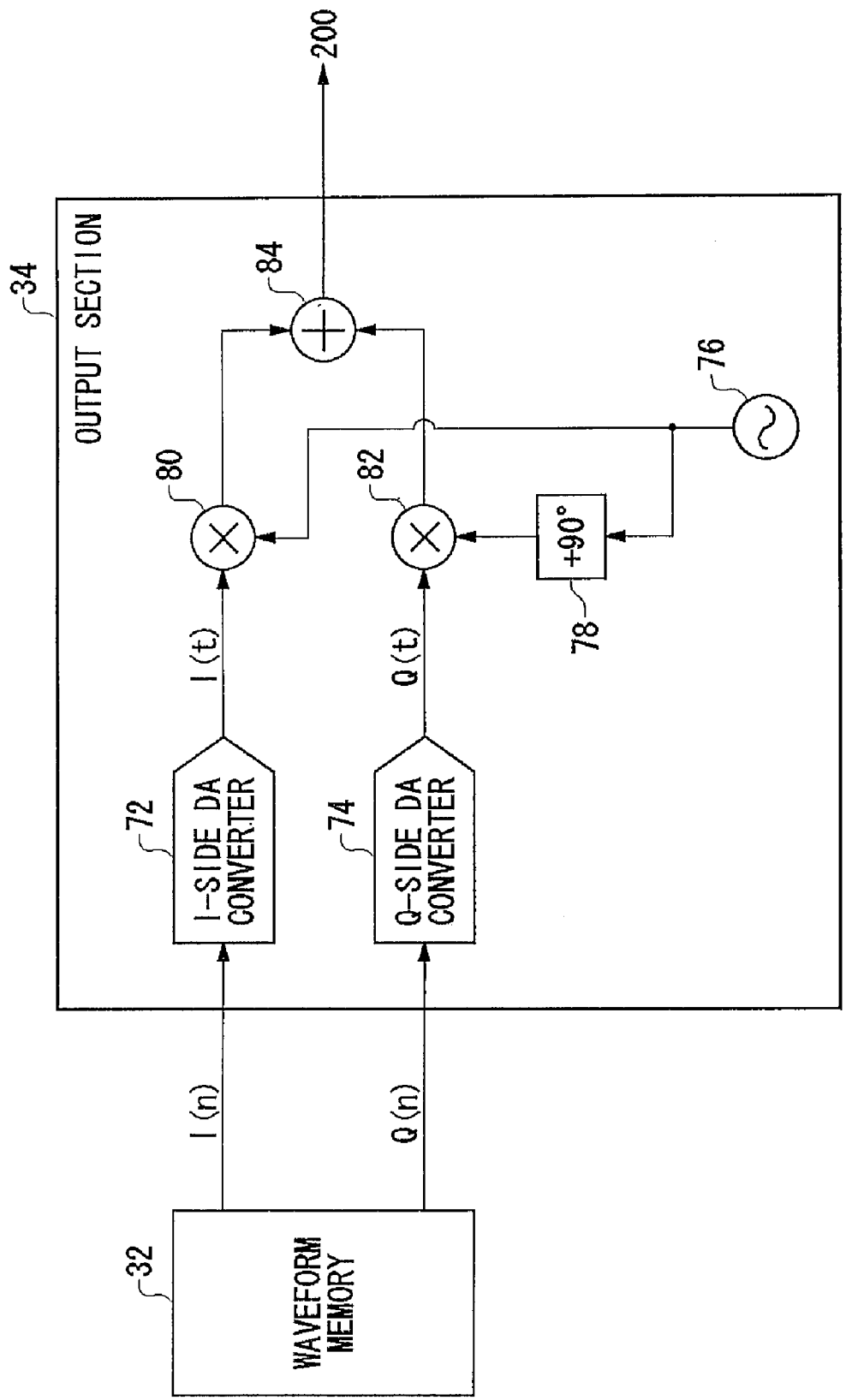
FIG. 10 shows a second example of the configuration of the output section 34, together with the waveform memory 32.

FIG. 10 shows a second example of the configuration of the output section 34, together with the waveform memory 32. The output section 34 may, for example, include an I-side DA converter 72, a Q-side DA converter 74, a carrier generator 76, a +90-degree phase shifter 78, an I-side multiplier 80, a Q-side multiplier 82, and an adder 84. Since the I-side DA converter 72 and the Q-side DA converter 74 according to the second example have the same function and configuration as those of the members according to the first example shown in FIG. 9 having the same reference numerals, explanation thereof will be omitted except any differences.

The I-side DA converter 72 outputs a generated analog signal to the I-side multiplier 80. The Q-side DA converter 74 outputs a generated analog signal to the Q-side multiplier 82.

The carrier generator 76 generates a carrier signal having a predetermined frequency. The +90-degree phase shifter 78 shifts the phase of the carrier signal generated by the carrier generator 76 by +90 degrees. The I-side multiplier 80 multiplies the real number components (I(t)) in the signal obtained by MSK-modulating an after-change data sequence, which are output from the I-side DA converter 72, by the carrier signal generated by the carrier generator 76. The Q-side multiplier 82 multiplies the imaginary number components (Q(t)) in the signal obtained by MSK-modulating the after-change data sequence, which are output from the Q-side DA converter 74, by the carrier signal generated by the carrier generator 76.

The adder 84 adds together the signal obtained by multiplying the real number components (I(t)) by the carrier signal and the signal obtained by multiplying the imaginary number components (Q(t)) by the carrier signal. Then, the adder 84 outputs the signal obtained from the addition to the DUT 200. In this manner, the output section 34 can output a modulation signal obtained by modulating a test signal which repeats the waveform represented by the basic waveform data to the carrier signal, to the DUT 200.

Figure 11:
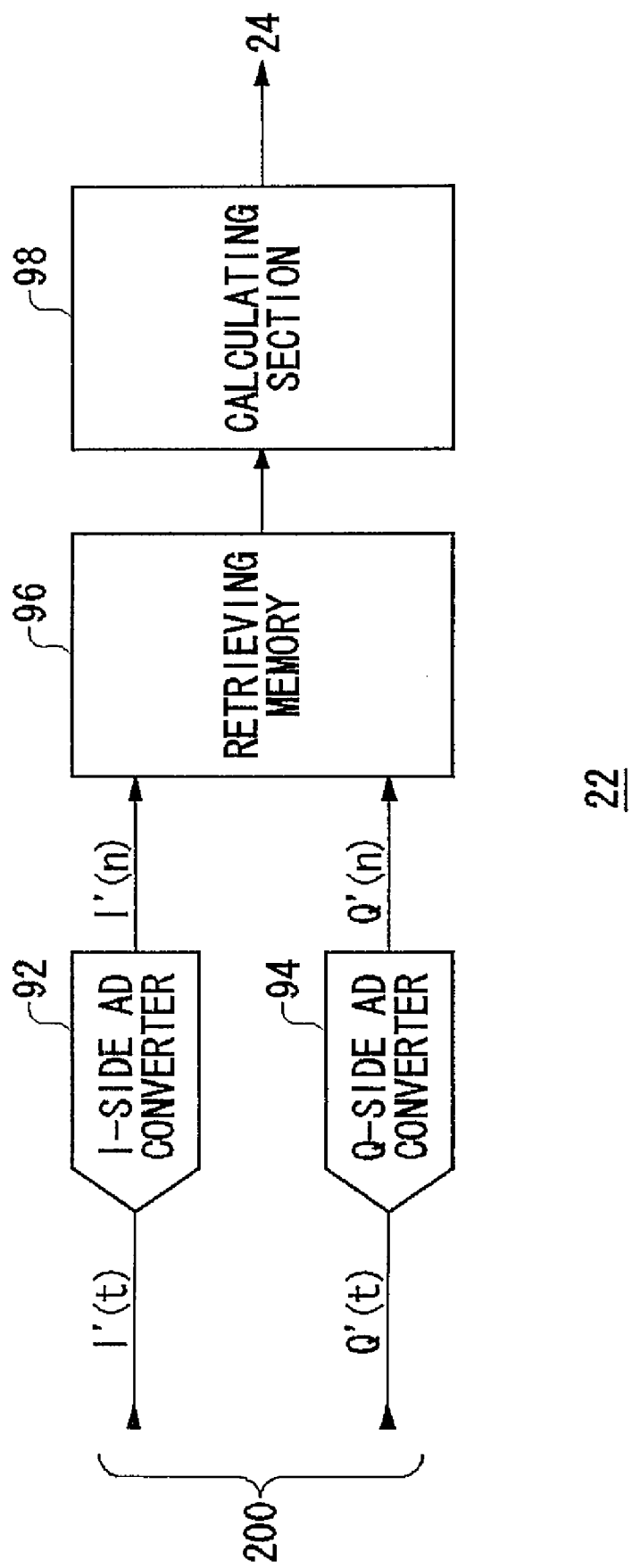
FIG. 11 shows a first example of the configuration of a measuring section 22.

FIG. 11 shows a first example of the configuration of the measuring section 22. The measuring section 22 may, for example, include an I-side AD converter 92, a Q-side AD converter 94, a retrieving memory 96, and a calculating section 98.

In the first example, the DUT 200 outputs an output signal which is separated into real number components (I'(t)) and imaginary number components (Q'(t)), in response to a test signal being supplied thereto. For example, in a case where the DUT 200 is an amplifier, the DUT 200 outputs a signal obtained by amplifying the test signal supplied thereto, as an output signal. In a case where the DUT 200 is a demodulator, the DUT 200 demodulates a modulation signal obtained by modulating a test signal, and outputs the signal obtained from the demodulation as an output signal.

The I-side AD converter 92 samples the real number components (I'(t)) of the output signal output from the DUT 200 in response to the test signal. That is, the I-side AD converter 92 sequentially samples the real number components of the output signal at the sampling rate, and through analog-to-digital conversion, outputs a sequence (I'(n)) of digital values corresponding to the real number components of the output signal. The Q-side AD converter 94 samples the imaginary number components (Q'(t)) of the output signal output from the DUT 200 in response to the test signal. That is, the Q-side AD converter 94 sequentially samples the imaginary number components of the output signal at the sampling rate, and through analog-to-digital conversion, outputs a sequence (Q'(n)) of digital values corresponding to the imaginary number components of the output signal.

Further, the I-side AD converter 92 and the Q-side AD converter 94 may, for example, sample the output signal according to a clock that is synchronous with the sampling rate of the waveform generator 20. Thereby, the I-side AD converter 92 and the Q-side AD converter 94 can eliminate any clock error between the sender side and the receiver side.

The retrieving memory 96 stores the output signal sampled by the I-side AD converter 92 and the Q-side AD converter 94. The calculating section 98 calculates characteristics of the DUT 200 based on the sequence of output signals stored in the retrieving memory 96. For example, the calculating section 98 may perform calculation of the spectrum characteristic of the output signal, calculation of leak electricity to any channel having a close frequency, and calculation of the electrical power at each frequency within a range of frequencies to be measured, with the outside of the range masked.

Then, the calculating section 98 outputs the results of calculations to the comparing section 24. In this manner, the measuring section 22 can measure the characteristics of the DUT 200 based on the output signal, which is output in response to a test signal being supplied.

Figure 12:
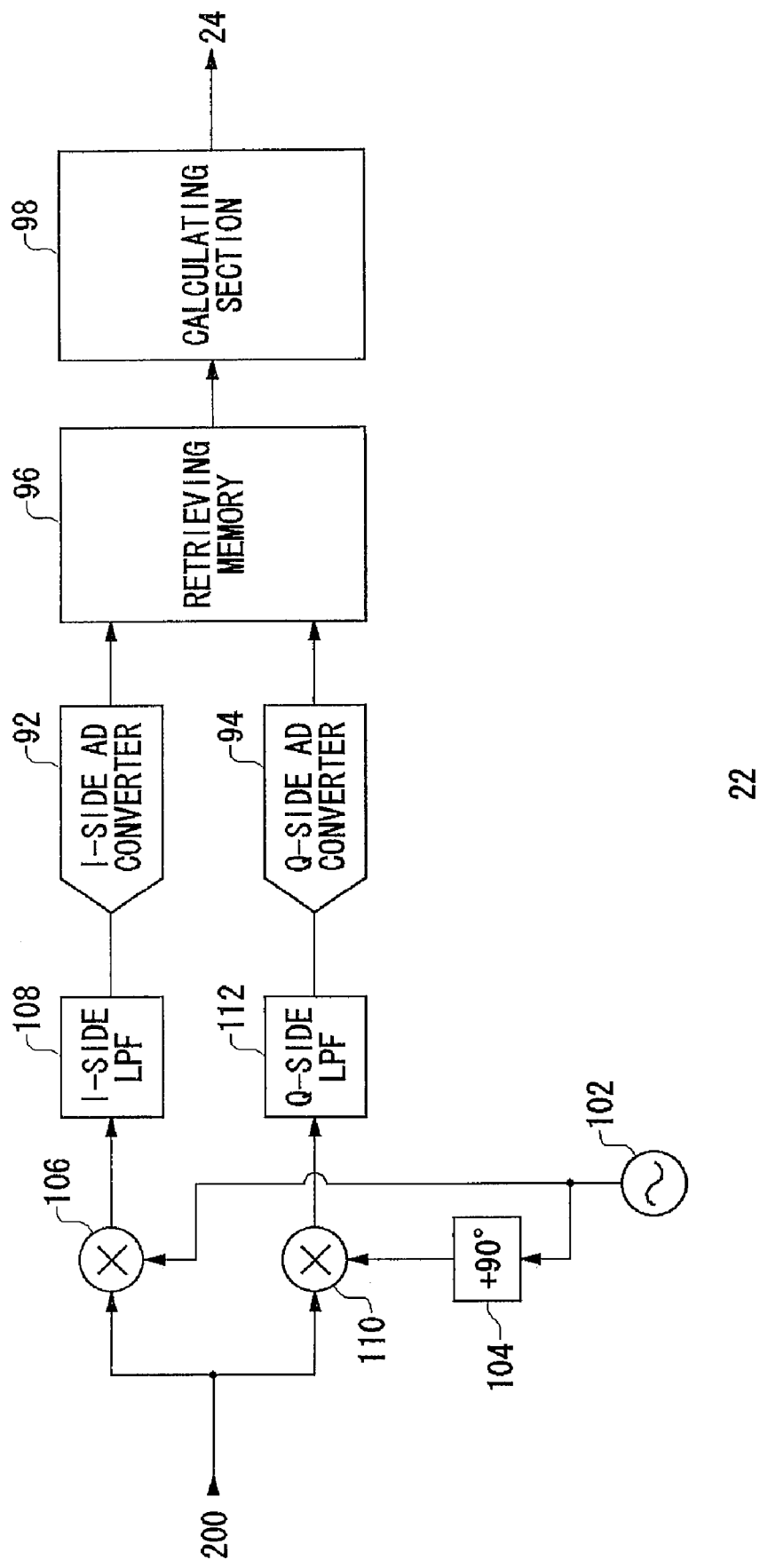
FIG. 12 shows a second example of the configuration of the measuring section 22.

FIG. 12 shows a second example of the configuration of the measuring section 22. For example, the measuring section 22 may include an I-side AD converter 92, a Q-side AD converter 94, a retrieving memory 96, a calculating section 98, a reference signal generator 102, a +90-degree phase shifter 104, an I-side multiplier 106, an I-side LPF 108, a Q-side multiplier 110, and a Q-side LPF 112. Since the I-side AD converter 92, the Q-side AD converter 94, the retrieving memory 96, and the calculating section 98 according to the second example have the same function and configuration as those of the members according to the first example shown in FIG. 11 having the same reference numerals, explanation thereof will be omitted except any differences.

In the second example, the DUT 200 outputs a modulation signal obtained by orthogonally modulating real number components (I(t)) and imaginary number components (Q(t)) as an output signal, in response to a test signal being supplied thereto. For example, in a case where the DUT 200 is an amplifier, the DUT 200 outputs a signal obtained by amplifying a modulation signal obtained by modulating a test signal, as an output signal. Further, in a case where the DUT 200 is, for example, a modulator, the DUT 200 outputs a modulation signal obtained by modulating a test signal supplied thereto, as an output signal.

The reference signal generator 102 generates a reference signal having the same frequency as the carrier signal of the modulation signal which it receives. The +90-degree phase shifter 104 shifts the phase of the reference signal generated by the reference signal generator 102 by +90 degrees. The I-side multiplier 106 multiplies the received modulation signal by the reference signal generated by the reference signal generator 102. The I-side LPF 108 subjects the signal obtained by multiplying the reference signal and the modulation signal to low-pass filtering to eliminate sum frequency components. As a result, the I-side LPF 108 can output the real number components (I'(t)) of the signal which has been orthogonally modulated to the modulation signal.

The Q-side multiplier 110 multiplies the received modulation signal by the reference signal output from the +90-degree phase shifter 104, whose phase has been shifted by +90 degrees. The Q-side LPF 112 subjects the signal obtained by multiplying the modulation signal by the reference signal whose phase has been shifted by +90 degrees to low-pass filtering to eliminate sum frequency components. As a result, the Q-side LPF 112 can output the imaginary number components (Q'(t)) of the signal which has been orthogonally modulated to the modulation signal.

The I-side AD converter 92 samples the real number components (I'(t)) output from the I-side LPF 108. The Q-side AD converter 94 samples the imaginary number components (Q'(t)) output from the Q-side LPF 112. In this manner, the measuring section 22 can measure the characteristics of the DUT 200 based on the modulation signal output in response to a test signal being supplied.

Figure 13:
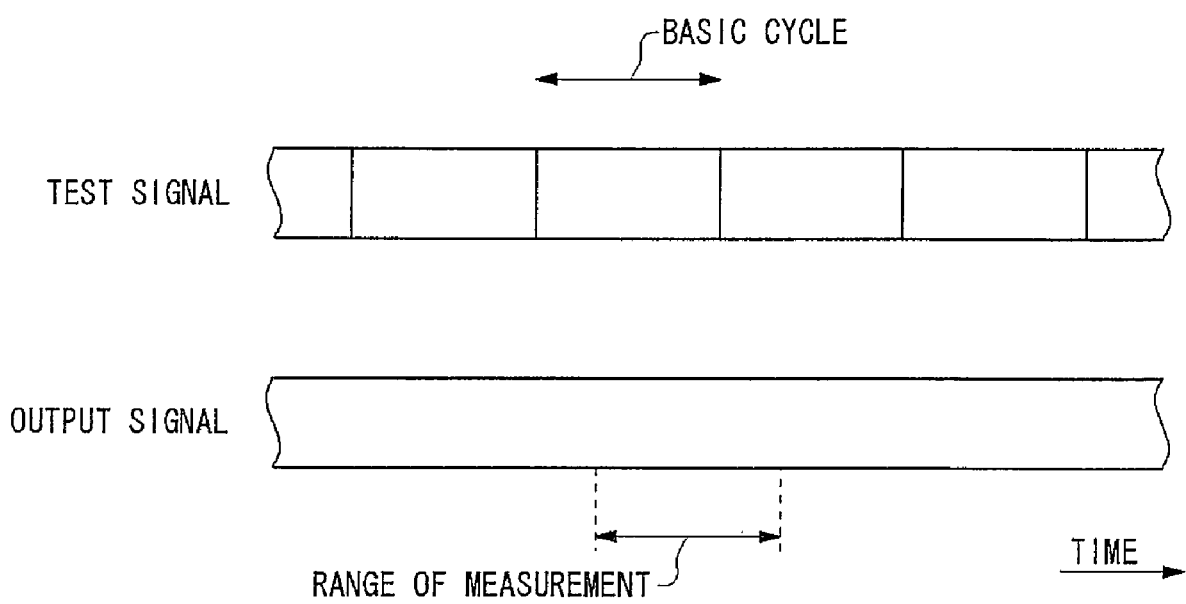
FIG. 13 shows the range of measurement by the measuring section 22 according to an embodiment of the present invention.

FIG. 13 shows the range of measurement by the measuring section 22 according to the present embodiment. For example, the measuring section 22 may acquire an output signal having a temporal duration corresponding to an integer multiple of the cycle (basic cycle) of the waveform corresponding to the basic waveform data asynchronously with the repeating waveform of the test signal, and measure characteristics of the DUT 200 based on the acquired output signal. For example, in measuring the electric power of an output signal, the measuring section 22 may acquire an output signal having a temporal duration that corresponds to an integer multiple of the basic cycle, and measure the electric power based on the acquired output signal.

Since the test signal output from the waveform generator 20 has the same waveform in each basic cycle, no matter from which position in the output signal a signal amounting to the basic cycle (or to a period corresponding to an integer multiple of the basic cycle) is extracted, the electric power of the extracted signal will be the same. Accordingly, the measuring section 22 can extract a signal amounting to a period corresponding to an integer multiple of the basic cycle from an arbitrary position, and measure characteristics, such as electric power, etc. of the extracted signal.

For example, in a case where the sampling number of the basic waveform data is a two's power, the measuring section 22 may acquire an output signal including the same number of points as the sampling number of the basic waveform data (or a number of points that is a two's power of the sampling number of the basic waveform data) from an arbitrary position, and calculate the spectrum by FFT operation.

Thereby, the measuring section 22 can measure the electric power, etc. of the output signal, without synchronizing with the cycle at which the waveform of the test signal is repeated. For example, the measuring section 22 can calculate the spectrum of the output signal, without performing control to regulate the calculation range for the FFT operation. Further, since the result of calculation is not affected by the position from which data is acquired, the measuring section 22 can calculate the spectrum of the output signal with high reproducibility.

Figure 14:
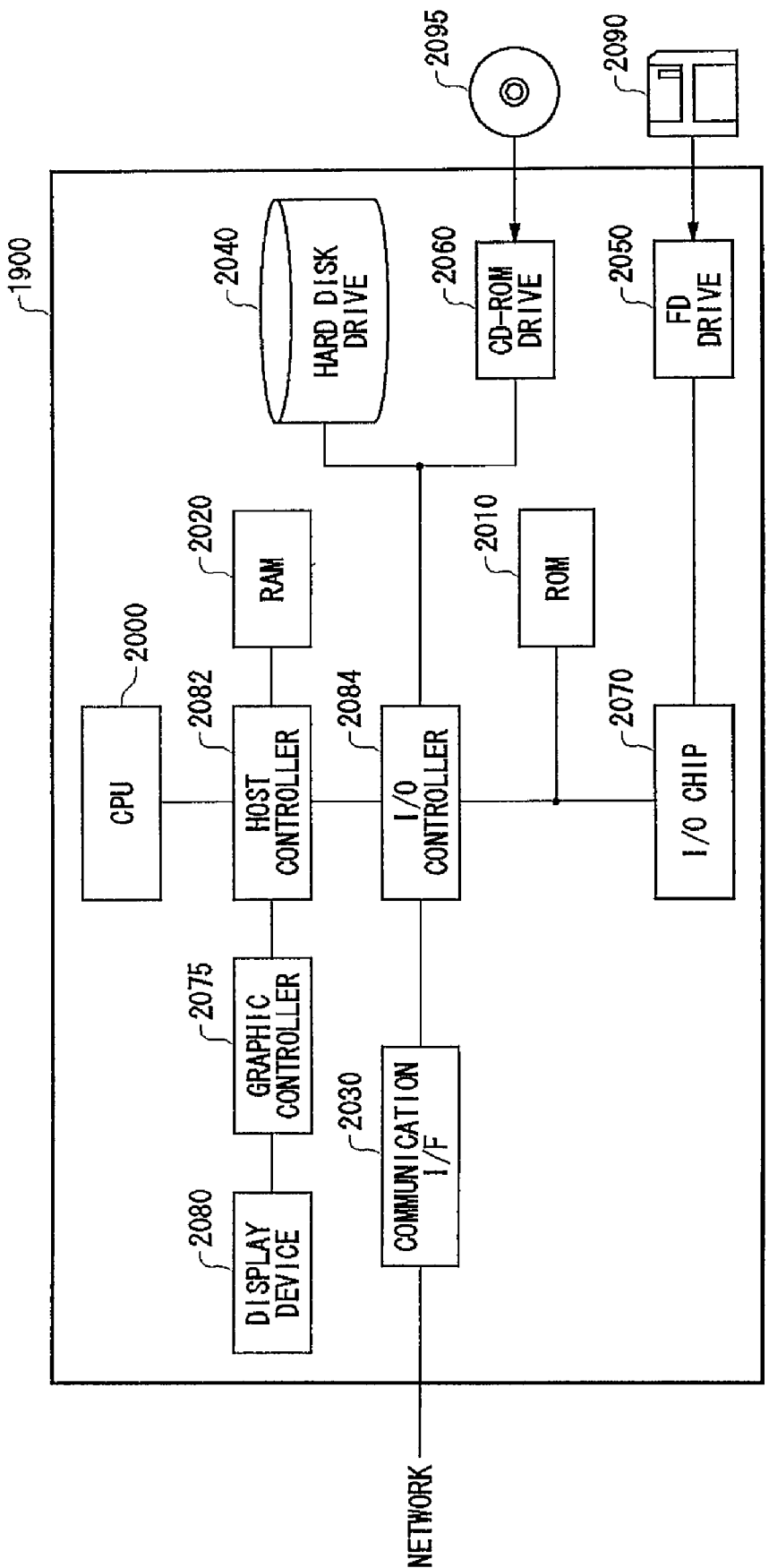
FIG. 14 shows one example of the hardware configuration of a computer 1900 according to the present embodiment.

FIG. 14 shows one example of the hardware configuration of a computer 1900 according to the present embodiment. The computer 1900 according to the present embodiment includes a CPU-peripheral section including a CPU 2000, a RAM 2020, a graphic controller 2075, and a display device 2080 which are connected to one another via a host controller 2082, an input/output section including a communication interface 2030, a hard disk drive 2040, and a CD-ROM drive 2060 which are connected to the host controller 2082 via an input/output controller 2084, and a legacy input/output section including a ROM 2010, a flexible disk drive 2050, and an input/output chip 2070 which are connected to the input/output controller 2084.

The host controller 2082 connects the RAM 2020 to the CPU 2000 and graphic controller 2075 which access the RAM 2020 at a high transmission rate. The CPU 2000 operate based on the programs stored in the ROM 2010 and the RAM 2020 to control each section. The graphic controller 2075 acquires image data which the CPU 2000, etc. generate on a frame buffer prepared within the RAM 2020, and displays it on the display device 2080. Instead of this, the graphic controller 2075 may include thereinside a frame buffer for storing image data generated by the CPU 2000, etc.

The input/output controller 2084 connects the host controller 2082 to the communication interface 2030, the hard disk drive 2040, and the CD-ROM drive 2060, which are relatively high-speed input/output devices. The communication interface 2030 communicates with another apparatus via a network. The hard disk drive 2040 stores programs and data used by the CPU 2000 in the computer 1900. The CD-ROM drive 2060 reads out programs or data from a CD-ROM 2095 and supplies them to the hard disk drive 2040 through the RAM 2020.

Further, the ROM 2010, the flexible disk drive 2050, and the input/output chip 2070, which are relatively low-speed input/output devices, are connected to the input/output controller 2084. The ROM 2010 stores a boot program executed when the computer 1900 is activated, programs specific to the hardware of the computer 1900, etc. The flexible disk drive 2050 reads out programs or data from a flexible disk 2090 and supplies them to the hard disk drive 2040 via the RAM 2020. The input/output chip 2070 connects various kinds of input/output devices via the flexible disk drive 2050, and, for example, a parallel port, a serial port, a keyboard port, a mouse port, etc.

The programs supplied to the hard disk drive 2040 via the RAM 2020 are provided by the user, as stored on a recording medium such as a flexible disk 2090, a CD-ROM 2095, an IC card, or the like. The programs are read out from the recording medium, installed on the hard disk drive 2040 in the computer 1900 via the RAM 2020, and executed by the CPU 2000.

A program installed on the computer 1900 to allow the computer 1900 to function as the waveform generating device 30 includes a data changing module and a waveform generating module. The program or modules work(s) on the CPU 2000, etc. to let the computer 1900 function as each of the data changing section 42 and the waveform generating section 44.

The program and modules mentioned above may be stored on an external storage medium. In addition to a flexible disk 2090 and a CD-ROM 2095, an optical recording medium such as a DVD, a CD, etc., an opto-magnetic recording medium such as an MO, etc., a tape medium, a semiconductor memory such as an IC card, etc. and the like can be used as a storage medium. Alternately, a storage medium such as a hard disk, a RAM, or the like, which is prepared in a server system connected to a special-purpose communication network or the Internet may be used as a recording medium to supply the program to the computer 1900 through a network.

One aspect of the present invention has been explained using an embodiment, but the technical scope of the present invention is not limited to the scope of disclosure of the above-described embodiment. Various modifications or alterations can be made upon the above-described embodiment. It is obvious from the statements of the claims that any embodiment upon which such modifications or alterations are made is included in the technical scope of the present invention.

What is claimed is:

1. A waveform generator for generating an analog signal, comprising:
   a data changing section which changes an input data sequence, which is a sequence of binary data and which is to be modulated to the signal that the waveform generator should generate, to generate an after-change data sequence such that in the signal to be obtained by MSK modulation, a residual phase obtained by dividing an initial phase of the signal by $2\pi$ and a residual phase obtained by dividing a final phase of the signal by $2\pi$ are continuous;
   a waveform generating section which generates basic waveform data representing a waveform corresponding to the signal obtained by subjecting the after-change data sequence to MSK modulation; and
   an output section which outputs the signal repeating the waveform represented by the basic waveform data,
   wherein the data changing section includes:

a phase difference calculating section which calculates a phase difference between an initial phase and a final phase of a waveform to be obtained by subjecting the input data sequence, which includes an even number of symbols, to the MSK modulation; and an inverting section which obtains the after-change data sequence by inverting data values of an odd number of symbols included in the input data sequence in a case where the phase difference is not an integer multiple of $2\pi$, and obtains the after-change data sequence by inverting data values of an even number of symbols included in the input data sequence in a case where the phase difference is an integer multiple of $2\pi$.

2. The waveform generator according to claim 1, wherein the phase difference calculating section calculates a difference between a frequency of appearance of a data value 0 and a frequency of appearance of a data value 1, and the inverting section obtains the after-change data sequence by inverting data values of an odd number of symbols included in the input data sequence in a case where the difference in frequency of appearance is not a multiple of 4, and obtains the after-change data sequence by inverting data values of an even number of symbols included in the input data sequence in a case where the difference in frequency of appearance is a multiple of 4.

3. The waveform generator according to claim 2, wherein the inverting section obtains the after-change data sequence by inverting a data value of any one symbol included in the input data sequence in a case where the phase difference is not an integer multiple of $2\pi$, and obtains the after-change data sequence by inverting a data value of none of the symbols included in the input data sequence in a case where the phase difference is an integer multiple of $2\pi$.

4. The waveform generator according to claim 2, wherein the data changing section further includes a number-of-symbols changing section which adds or deletes an odd number of symbols to or from the input data sequence which it receives in a case where the input data sequence includes an odd number of symbols, and supplies this input data sequence to the phase difference calculating section and the inverting section.

5. The waveform generator according to claim 2, wherein the data changing section receives a pseudorandom bit sequence as the input data sequence.

6. The waveform generator according to claim 1, wherein the inverting section obtains the after-change data sequence by inverting a data value of any one symbol included in the input data sequence in a case where the phase difference is not an integer multiple of $2\pi$, and obtains the after-change data sequence by inverting a data value of none of the symbols included in the input data sequence in a case where the phase difference is an integer multiple of $2\pi$.

7. The waveform generator according to claim 1, wherein the data changing section further includes a number-of-symbols changing section which adds or deletes an odd number of symbols to or from the input data sequence which it receives in a case where the input data sequence includes an odd number of symbols, and supplies this input data sequence to the phase difference calculating section and the inverting section.

8. The waveform generator according to claim 1, wherein the data changing section receives a pseudorandom bit sequence as the input data sequence.

9. A test apparatus which tests a device under test, comprising:

a data changing section which changes an input data sequence, which is a sequence of binary data and which is to be modulated to a signal to be supplied to the device under test, to generate an after-change data sequence such that in the signal to be obtained by MSK modulation, a residual phase obtained by dividing an initial phase of the signal by $2\pi$ and a residual phase obtained by dividing a final phase of the signal by $2\pi$ are continuous;

a waveform generating section which generates basic waveform data representing a waveform corresponding to the signal obtained by subjecting the after-change data sequence to MSK modulation;

an output section which outputs a test signal which repeats the waveform represented by the basic waveform data; and a measuring section which measures a characteristic of the device under test based on an output signal output from the device under test in response to the test signal.

10. The test apparatus according to claim 9, wherein the measuring section acquires the output signal having a temporal duration corresponding to an integer multiple of a cycle of the waveform corresponding to the basic waveform data asynchronously with the waveform of the test signal that is repetitive, and measures the characteristic of the device under test based on the acquired output signal.

11. The waveform generator according to claim 9, wherein the measuring section measures electrical power of the output signal output from the device under test in response to the test signal.

12. A waveform generating device which generates basic waveform data, which is a source of an analog signal to be generated by a waveform generator, the waveform generating device comprising:

a data changing section which changes an input data sequence, which is a sequence of binary data and which is to be modulated to the signal which the waveform generator should generate, to generate an after-change data sequence such that in the signal to be obtained by MSK modulation, a residual phase obtained by dividing an initial phase of the signal by $2\pi$ and a residual phase obtained by dividing a final phase of the signal by $2\pi$ are continuous; and a waveform generating section which generates basic waveform data representing a waveform corresponding to the signal obtained by subjecting the after-change data sequence to MSK modulation, wherein the data changing section includes:

a phase difference calculating section which calculates a phase difference between an initial phase and a final phase of a waveform to be obtained by subjecting the input data sequence, which includes an even number of symbols, to the MSK modulation; and an inverting section which obtains the after-change data sequence by inverting data values of an odd number of symbols included in the input data sequence in a case where the phase difference is not an integer multiple of $2\pi$, and obtains the after-change data sequence by inverting data values of an even number of symbols included in the input data sequence in a case where the phase difference is an integer multiple of $2\pi$.

13. A non-transitory machine readable medium storing a program for controlling an information processing apparatus to function as a waveform generating device which generates basic waveform data to be a source of an analog signal to be generated by a waveform generator, the program controlling the information processing apparatus to function as:
- a data changing section which changes an input data sequence, which is a sequence of binary data and which is to be modulated to the signal which the waveform generator should generate, to generate an after-change data sequence such that in the signal to be obtained by MSK modulation, a residual phase obtained by dividing an initial phase of the signal by $2\pi$ and a residual phase obtained by dividing a final phase of the signal by $2\pi$ are continuous; and
- a waveform generating section which generates basic waveform data representing a waveform corresponding to the signal obtained by subjecting the after-change data sequence to MSK modulation, wherein the data changing section includes:
- a phase difference calculating section which calculates a phase difference between an initial phase and a final phase of a waveform to be obtained by subjecting the input data sequence, which includes an even number of symbols, to the MSK modulation; and
- an inverting section which obtains the after-change data sequence by inverting data values of an odd number of symbols included in the input data sequence in a case where the phase difference is not an integer multiple of $2\pi$, and obtains the after-change data sequence by inverting data values of an even number of symbols included in the input data sequence in a case where the phase difference is an integer multiple of $2\pi$.

* * * * *